United States Patent [19]
Davis

[11] Patent Number: 6,060,901
[45] Date of Patent: May 9, 2000

[54] MULTIPLE FUNCTION ELECTRICAL CIRCUIT CONFIGURABLE BY ORIENTATION OF AN INTEGRATED CIRCUIT CHIP

[75] Inventor: Gerald C. Davis, Hillsborough, N.C.

[73] Assignee: Ericsson, Inc., RTP, N.C.

[21] Appl. No.: 09/122,826

[22] Filed: Jul. 27, 1998

[51] Int. Cl.[7] .................................................... G06F 7/38
[52] U.S. Cl. ............................ 326/37; 326/101; 326/104
[58] Field of Search .................................... 326/101, 104, 326/37, 30

[56] References Cited

U.S. PATENT DOCUMENTS 5,652,445  7/1997  Johnston ................................. 257/295

*Primary Examiner*—Michael Tokar
*Assistant Examiner*—Anh Tran
*Attorney, Agent, or Firm*—Coats & Bennett, P.L.L.C.

[57] ABSTRACT

An electrical circuit changes function based on the physical orientation of an indexible chip that can assume any one of a plurality of physical orientations. The indexible chip forms a portion of the electrical circuit and is operable between a plurality of physical orientations with respect to the balance of the electrical circuit. The function of the electrical circuit is dependent upon the physical orientation of the indexible chip. For instance, when the indexible chip is in a first orientation, the electrical circuit performs a first function and when the indexible chip is in a second orientation, the electrical circuit performs a second function, and so forth. The number of possible physical orientations of the indexible chip is at least two, but may be three, four, eight or more. The indexible chip includes a plurality of I/O ports and typically surrounded by a main housing. The I/O ports are preferably disposed symmetrically with respect to the center-point of the housing. Using the indexible chip, the function of the electrical circuit may be changed by simply removing the indexible chip (in a first orientation) from the electrical circuit; reorienting the indexible chip to a second physical orientation different from the first physical orientation; and returning the indexible chip to the electrical circuit in the second orientation. The change in function of the electrical circuit is thereby accomplished without requiring a software change in, or external to, the electrical circuit. In one embodiment, the electrical circuit forms at least a portion of a communications interface and the on-board circuits function as voltage level translators.

20 Claims, 7 Drawing Sheets

MULTIPLE FUNCTION ELECTRICAL CIRCUIT CONFIGURABLE BY ORIENTATION OF AN INTEGRATED CIRCUIT CHIP

FIELD OF THE INVENTION

The present invention relates generally to electrical circuits, and more particularly to a multiple function electrical circuit configurable by orientation of an integrated circuit chip therein.

BACKGROUND OF THE INVENTION

It is sometimes desirable to change the function of an electrical circuit, such as during the development stage of a new electronic device or during the manufacturing stage to implement a product change. Preferably, such a change can be implemented without adding to or deleting from the components which comprise the electrical circuit, including the traces or wires on any printed circuit board.

Frequently, such changes are implemented via software or firmware changes to programmable integrated circuit chips of the electrical circuit. One example of a programmable integrated circuit chip is the Maxim 214 IC made by Maxim Integrated Products of Sunnyvale California. This chip is designed to operate in conjunction with a Universal synchronous/Asynchronous Receiver/Transmitter (UART) to provide the various voltage levels required for two different communications interfaces. In one state, the Maxim 214 IC provides a serial port suitable for a Digital Communication Equipment (DCE) device. In another state, the Maxim 214 IC provides a serial port suitable for a Digital Terminal Equipment (DTE) device. The configuration state of the Maxim 214 IC is changed via external programmable control. That is, the Maxim 214 IC chip is provided with a control signal from a source external to the Maxim 214 IC chip which causes the Maxim 214 IC chip to change configuration states. To switch from DCE to DTE, or vice versa, no changes are required to the wiring or physical layout of the electrical circuit. In other words, to the human eye, there is no change to the electrical circuit.

However, programmable chips, such as the Maxim 214 IC, are typically more expensive than fixed function integrated circuit chips and require additional effort to program properly. In addition, it is not always foreseeable that such changes will be needed and designers therefore may not include such programmable chips in their designs. Accordingly, there remains a need for electrical circuits that allow for additional methods of changing the function of the electrical circuit.

SUMMARY OF THE INVENTION

The electrical circuit of the present invention changes function based on the physical orientation of an indexible chip that can assume any one of a variety of physical orientations. The selection of which one of the orientations the indexible chip should assume may be changeable after initial manufacturing or may be relatively fixed at manufacturing.

The indexible chip forms a portion of the electrical circuit and is operable between a plurality of physical orientations with respect to the balance of the electrical circuit. The function of the electrical circuit is dependent upon the physical orientation of the indexible chip. For instance, when the indexible chip is in a first orientation, the electrical circuit performs a first function and when the indexible chip is in a second orientation, the electrical circuit performs a second function, and so forth. The number of possible physical orientations of the indexible chip is at least two, but may be three, four, eight or more. Preferably, the indexible chip is connected to the balance of the electrical circuit by a socket which releasably retains the indexible chip.

The exterior of the indexible chip is optionally similar to the exterior of a common integrated circuit chip. The indexible chip preferably includes a plurality of on-board circuits connected to a plurality of I/O ports and typically surrounded by a main housing. The I/O ports are preferably disposed symmetrically with respect to the center-point of the housing. In most embodiments, the indexible chip further includes a plurality of ground ports and a plurality of power ports, likewise disposed symmetrically with respect to the center-point, which correspond to the number of possible orientations in number. The function of the on-board circuits may be related or unrelated; in one preferred embodiment, there are two on-board circuits and their functions are inverse.

In one embodiment, the electrical circuit forms at least a portion of a communications interface and the on-board circuits function as voltage level translators. For example, the electrical circuit functions as a portion of a DCE communications interface when the indexible chip is in a first physical orientation and as a portion of a DTE communications interface when the indexible chip is in a second physical orientation.

Using the indexible chip, the function of the electrical circuit may be changed by simply removing the indexible chip (in a first orientation) from the electrical circuit; reorienting the indexible chip to a second physical orientation different from the first physical orientation; and returning the indexible chip to the electrical circuit in the second orientation. The programming of the function of the electrical circuit is thereby accomplished without requiring a software change in, or external to, the electrical circuit. In some alternative embodiments, additional changes, such as changes to software, may also be desirable. In short, the present invention includes all electrical circuits programmable in whole or in part by the orientation of an indexible chip, whether accompanied by software changes or not.

DETAILED DESCRIPTION

Figure 1:
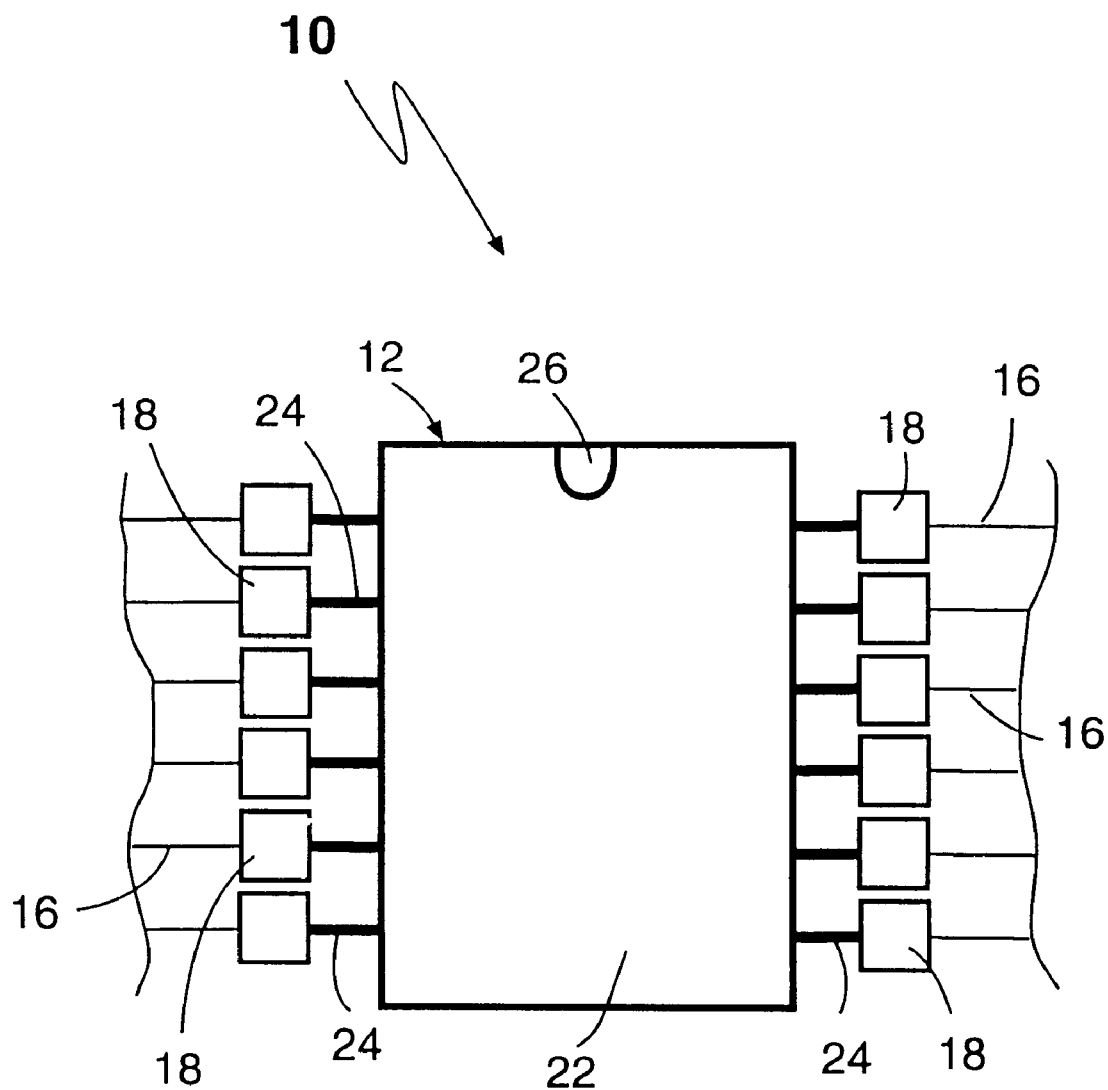
FIG. 1 is a partial overhead view of an integrated circuit chip in an electrical circuit.

Electrical circuits 10 typically include a plurality of integrated circuit (IC) chips 12, transistors, connectors 14, and the like, interconnected by various circuit traces 16, such as those on a printed circuit board. The IC chips 12 typically include a main housing 22 having numerous leads 24 extending therefrom. The leads 24 connect, typically via a plurality of pad connections 18, to other parts of an electrical circuit 10 of which the IC chip 12 forms a part. Typically, there is a notch or other indicator 26 on one end or the other of the IC chip main housing 22 for identifying the orientation of the IC chip 10. Internal to the main housing 22, and connected to the leads 24, are the on-board circuits 30. The on-board circuits 30 may be of any type known in the art and are typically etched on a semiconductor substrate such as silicon, gallium arsenide, or other materials well known in the art.

The leads 24 may be typically classified as either power, ground, or input/output ports. Ground ports 32 are intended to be connected to the local ground plane. Power ports 34 are intended to be connected to the local power source (VCC), such as +/−5 volts. Together, the ground ports 32 and the power ports 34 provide power to the on-board circuits 30. Input/output ports (I/O ports) 36 connect to traces 16 carrying various signals. The I/O ports 36 provide the input and output paths for the signals acted upon by the on-board circuits 30.

Figure 2:
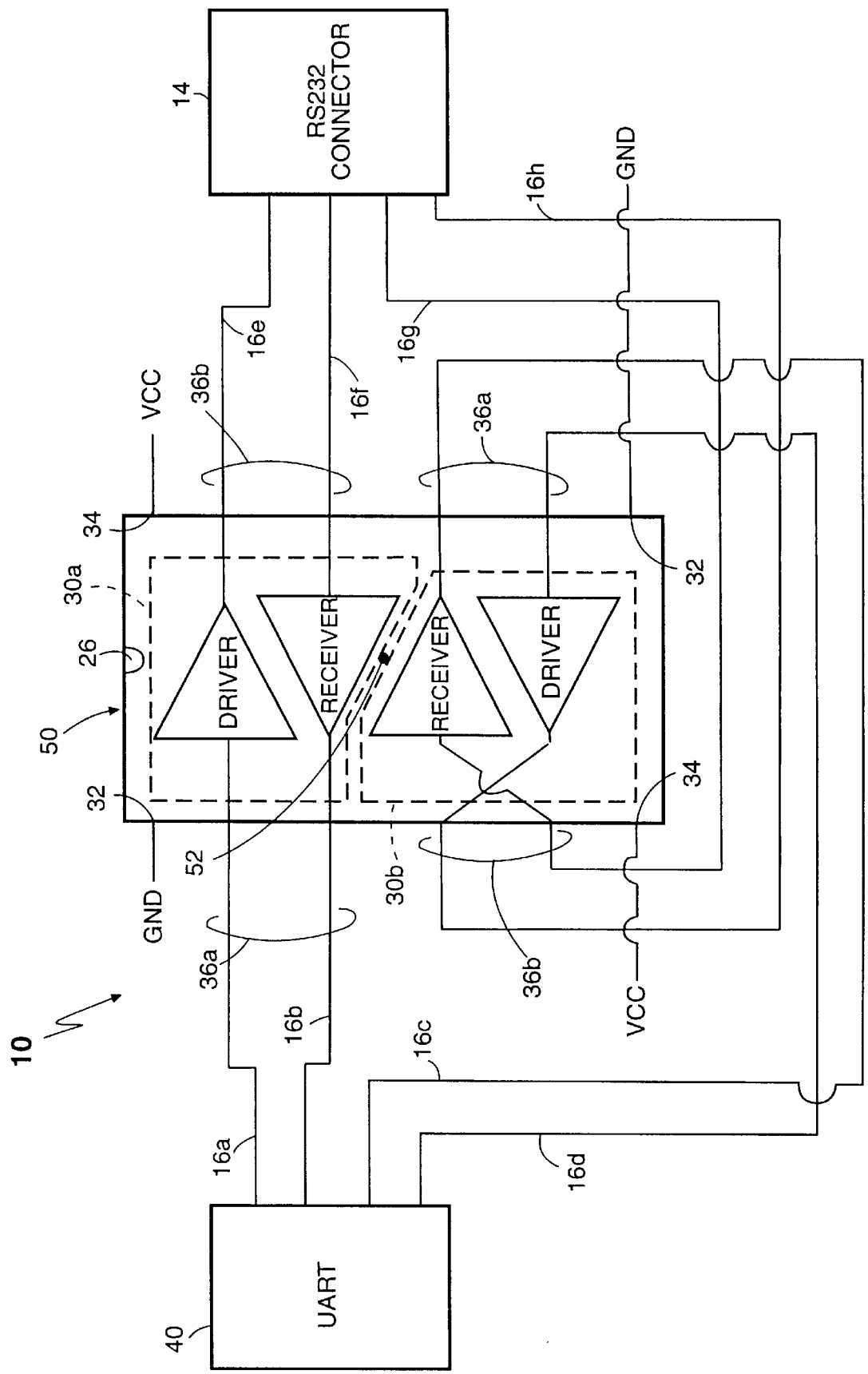
FIG. 2 is an electrical schematic of an electrical circuit according to the present invention which includes an indexible chip in a first orientation and which functions as a portion of a DCE communications interface.

Shown in FIG. 2 is an electrical circuit 10 that is useful for communications interfaces. This electrical circuit includes a UART 40, a connector 14, an indexible chip 50, and the interconnecting circuit traces 16a–h. The indexible chip 50 of FIG. 2 has a similar exterior to a traditional IC chip 12 described above. The orientation of the indexible chip 50 shown in FIG. 2 is in the normal default orientation used for a DCE connection, as indicated by the location of the notch 26 on the indexible chip's housing 24 with respect to the balance of the electrical circuit 10. The indexible chip 50 includes two ground ports 32 disposed at opposite corners of the housing 22 which are interconnected internal to the indexible chip 50. The indexible chip 50 further includes two power ports 34 likewise disposed at opposite corners of the housing 22 and interconnected internal to the indexible chip 50.

For purposes of illustration, circuit traces 16a and 16e may be for TXD signals, traces 16b and 16f for RXD signals, traces 16c and 16g for RTS signals, and traces 16d and 16f for CTS signals. The traces 16a–d directly connecting to the UART 40, are at TTL levels (+/−5 volts) and the traces 16e–f directly connecting to the connector 14 are at RS232 levels (+/−15 volts).

The indexible chip 50 of FIG. 2 includes a plurality of I/O ports 36 of two general types. The first type is TTL level I/O ports 36a; the second type is RS232 level I/O ports 36b. Each type of I/O ports 36a, 36b is arrayed symmetrically about the center point 52 of the indexible chip 50. One half of the TTL level I/O ports 36a are connected via a first set of on-board circuits 30a to one half of the RS232 level I/O ports 36b; the other half of the TTL level I/O ports 36a are connected via a second set of on-board circuits 30b to the other half of the RS232 I/O ports 36b. For the indexible chip 50 of FIG. 2, each on-board circuits 30 includes a driver whose output is at RS232 level and a receiver whose output is at TTL level. In this orientation of the indexible chip 50, traces 16a–b are connected via the first set of on-board circuits 30a to traces 16e–f and traces 16c–d are connected via the second set of on-board circuits 30b to traces 16g–h. With the indexible chip 50 in this first orientation, the electrical circuit 10 functions as a portion of a DCE communications interface.

Figure 3:
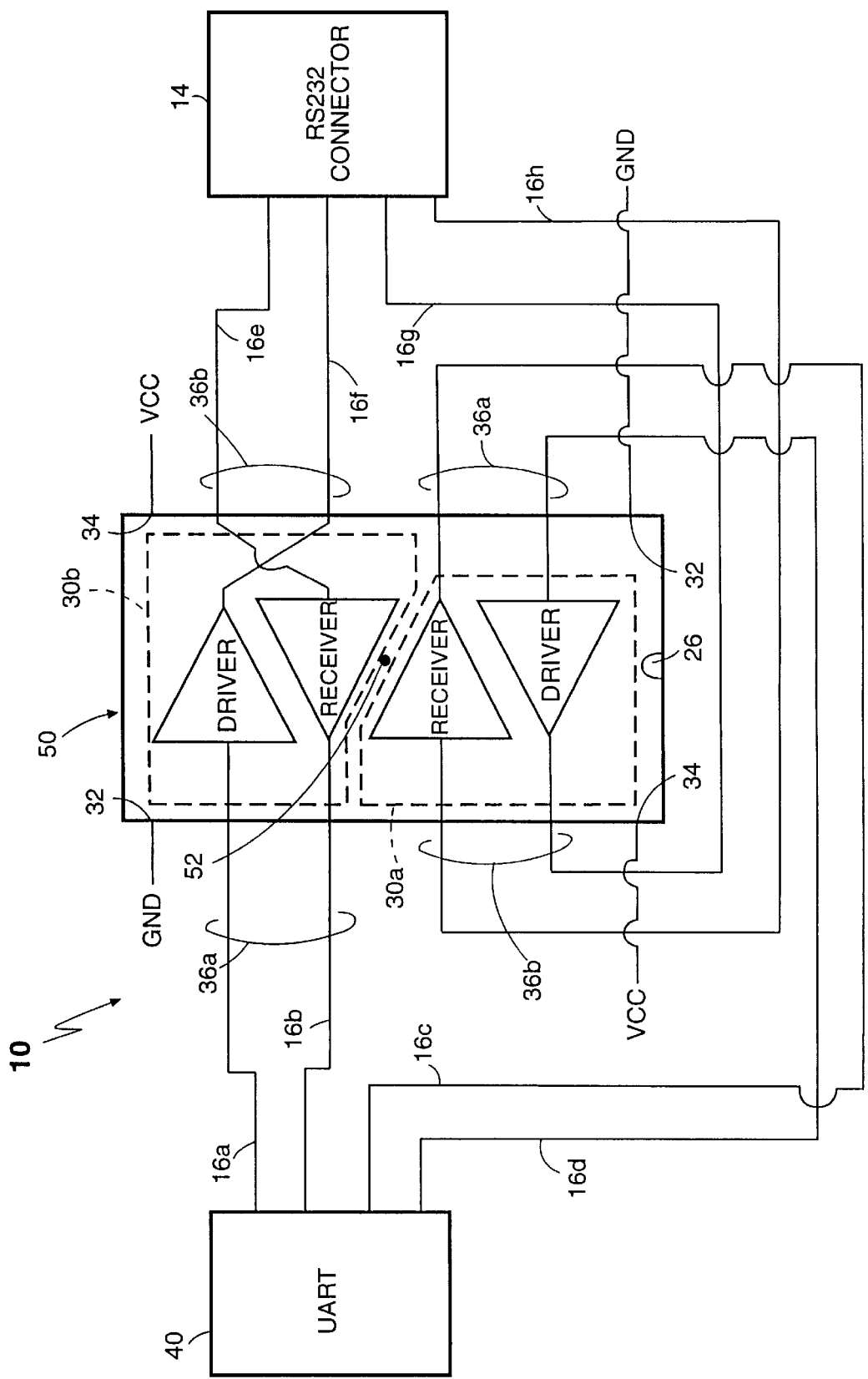
FIG. 3 is an electrical schematic of the electrical circuit of FIG. 2 with the indexible chip in a second orientation and which functions as a portion of a DTE communications interface.

In FIG. 3, the indexible chip 50 of FIG. 2 has been rotated 180° about its center-point 52, thereby changing the indexible chip's orientation. In this orientation, traces 16a–b are now connected via the second set of on-board circuits 30b to traces 16e–f and traces 16c–d are now connected via the first set of on-board circuits 30a to traces 16g–h. Thus, the function supplied by the first set of on-board circuits 30a is applied to traces 16c–d, 16g–h rather than traces 16a–b, 16e–f and the function supplied by the second set of on-board circuits 30b is applied to traces 16a–b, 16e–f, rather than traces 16c–d, 16g–h. As with the electrical circuit 10 of FIG. 2, the traces 16a–d directly connecting to the UART 40, are at TTL levels (+/−5 volts) and the traces 16e–h directly connecting to the connector 14 are at RS232 levels (+/−15 volts). With the indexible chip 50 in this second orientation, the electrical circuit 10 functions as a portion of a DTE communications interface.

As shown by comparing FIG. 2 and FIG. 3, the function of the electrical circuit 10 may be altered by changing the physical orientation of the indexible chip 50. Utilizing the same circuit traces 16a–h and other components of the electrical circuit 10, the electrical circuit 10 functions as a portion of a DCE interface with the indexible chip 50 in one orientation and as a portion of a DTE interface with the indexible chip 50 in another orientation. Thus, the function of the electrical circuit 10, of which the indexible chip 50 is a part, is configurable by the physical orientation of the indexible chip 50.

The change in function of the electrical circuit 10 between FIG. 2 and FIG. 3 is accomplished without requiring a software change in, or external to, the electrical circuit 10. However, this is not to say that accompanying software changes are not allowed. Indeed, the present invention includes all electrical circuits configurable in whole or in part by the orientation of an indexible chip 50, whether accompanied by software changes or not.

Figure 4A:
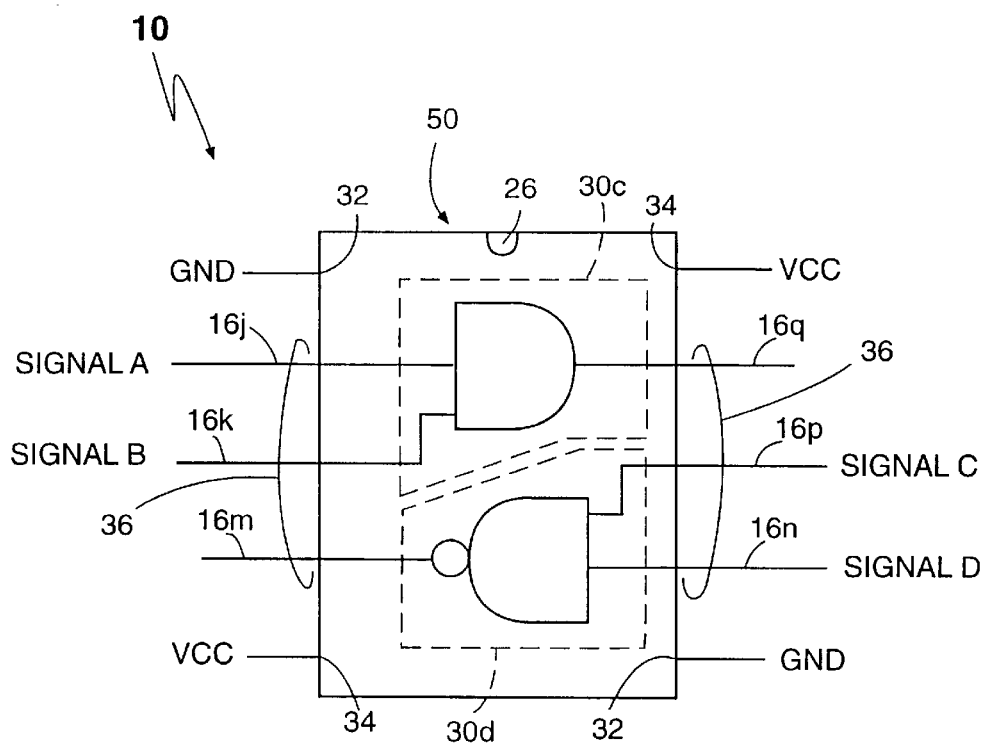
FIG. 4A is an electrical schematic of an alternative embodiment of the electrical circuit of the present invention with an indexible chip in a first orientation which functions to logically AND signal A with signal B and to logically NAND signal C with signal D.
Figure 4B:
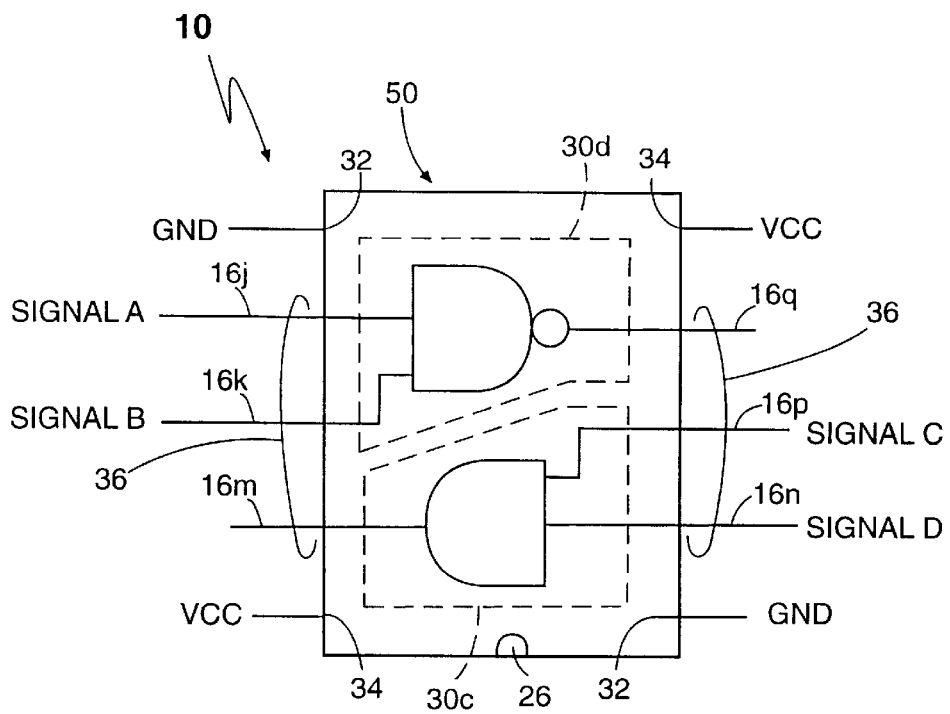
FIG. 4B is an electrical schematic of the electrical circuit of FIG. 4A with the indexible chip in a second orientation and which functions to logically NAND signal A with signal B and to logically AND signal C with signal D.

FIGS. 4A and 4B show another embodiment of an electrical circuit 10 configurable by orientation of an indexible chip 50. The indexible chip 50 of FIGS. 4A and 4B is different from the indexible chip 50 of FIGS. 2 and 3 in that the on-board circuits 30 are different and the number of I/O ports 36 are different. In FIG. 4A, the indexible chip 50 is in its first orientation. In this orientation, traces 16j, 16k are connected to trace 16q via the first on-board circuit 30c, which is shown as an AND gate, while traces 16n, 16p are connected to trace 16m via the second on-board circuit 30d, which is shown as an NAND gate. In the FIG. 4A orientation, the electrical circuit 10 functions to logically AND signal A with signal B and to logically NAND signal C with signal D. In FIG. 4B, the same indexible chip 50 is shown now in a second orientation. In this second orientation, traces 16j, 16k are connected to trace 16q via the NAND gate 30d, while traces 16n, 16p are connected to trace 16m via the AND gate 30c. In the FIG. 4B orientation, the electrical circuit 10 functions to logically NAND signal A with signal B and to logically AND signal C with signal D. Thus, the electrical circuit 10 of FIGS. 4A and 4B is configurable to provide different function based on the physical orientation of the indexible chip 50.

Figure 5A:
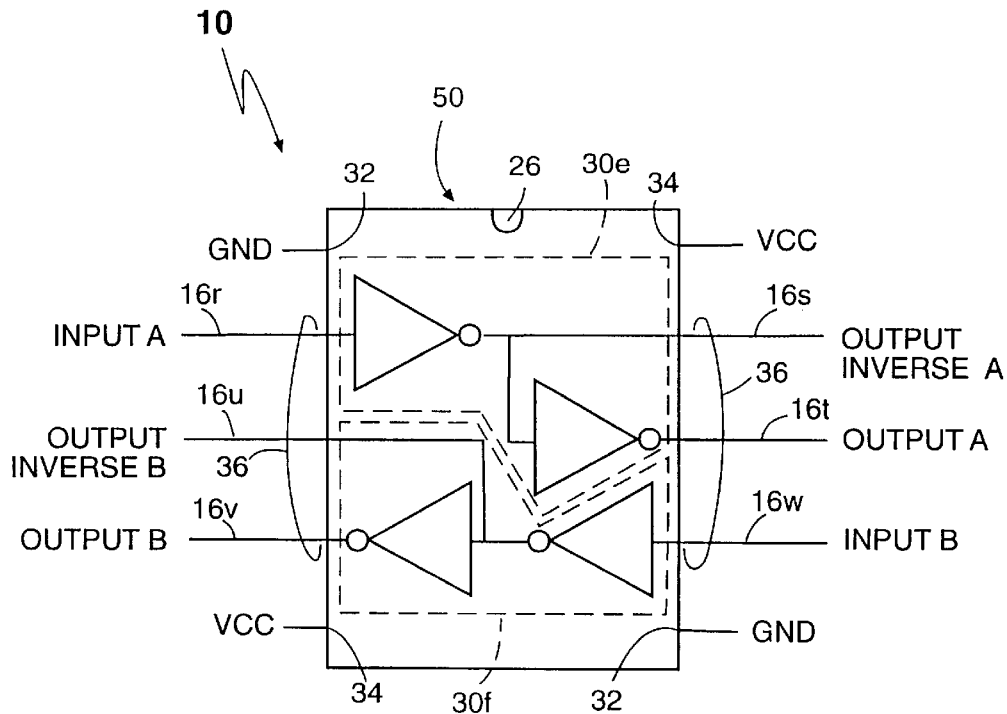
FIG. 5A is an electrical schematic of another alternative embodiment of the electrical circuit of the present invention with an indexible chip in a first orientation.
Figure 5B:
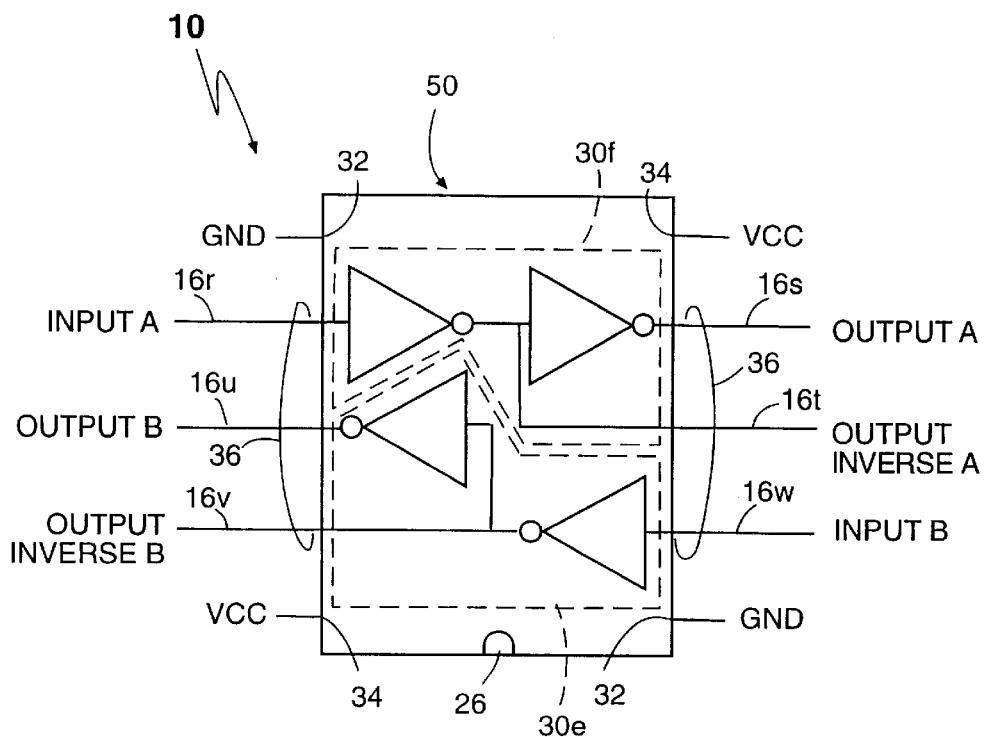
FIG. 5B is an electrical schematic of the electrical circuit of FIG. 5A with the indexible chip in a second orientation.

FIGS. 5A and 5B show another embodiment of an electrical circuit 10 configurable by orientation of an indexible chip 50. The indexible chip 50 of FIGS. 5A and 5B is different from the indexible chip 50 of FIGS. 4A and 4B in that the on-board circuits 30 are different. In FIG. 5A, the indexible chip 50 is in its first orientation. In this orientation, trace 16r is connected to traces 16s, 16t via the first on-board circuit 30e, while trace 16w is connected to traces 16u, 16v via the second on-board circuit 30d. In the FIG. 5A orientation, the electrical circuit 10 functions to receive input signal A on trace 16r and output signal A on trace 16t and the inverse of signal A on trace 16s. Likewise, in the FIG. 5A orientation, signal B is input on trace 16w and output on trace 16v while the inverse of B is output on trace 16u. In FIG. 5B, the same indexible chip 50 is shown now in a second orientation. In this second orientation, trace 16r is connected to traces 16s, 16t via the second on-board circuit 30f, while trace 16w is connected to traces 16u, 16v via the first on-board circuit 30e. In the FIG. 5B orientation, the output on traces 16s, 16t are reversed with respect to the FIG. 5A orientation; likewise with traces 16u, 16v. Thus, the function of the electrical circuit in FIG. 5A can be considered the inverse of that in FIG. 5B. Accordingly, the electrical circuit 10 of FIGS. 5A and 5B is configurable to provide different functionality based on the physical orientation of the indexible chip 50.

Figure 6:
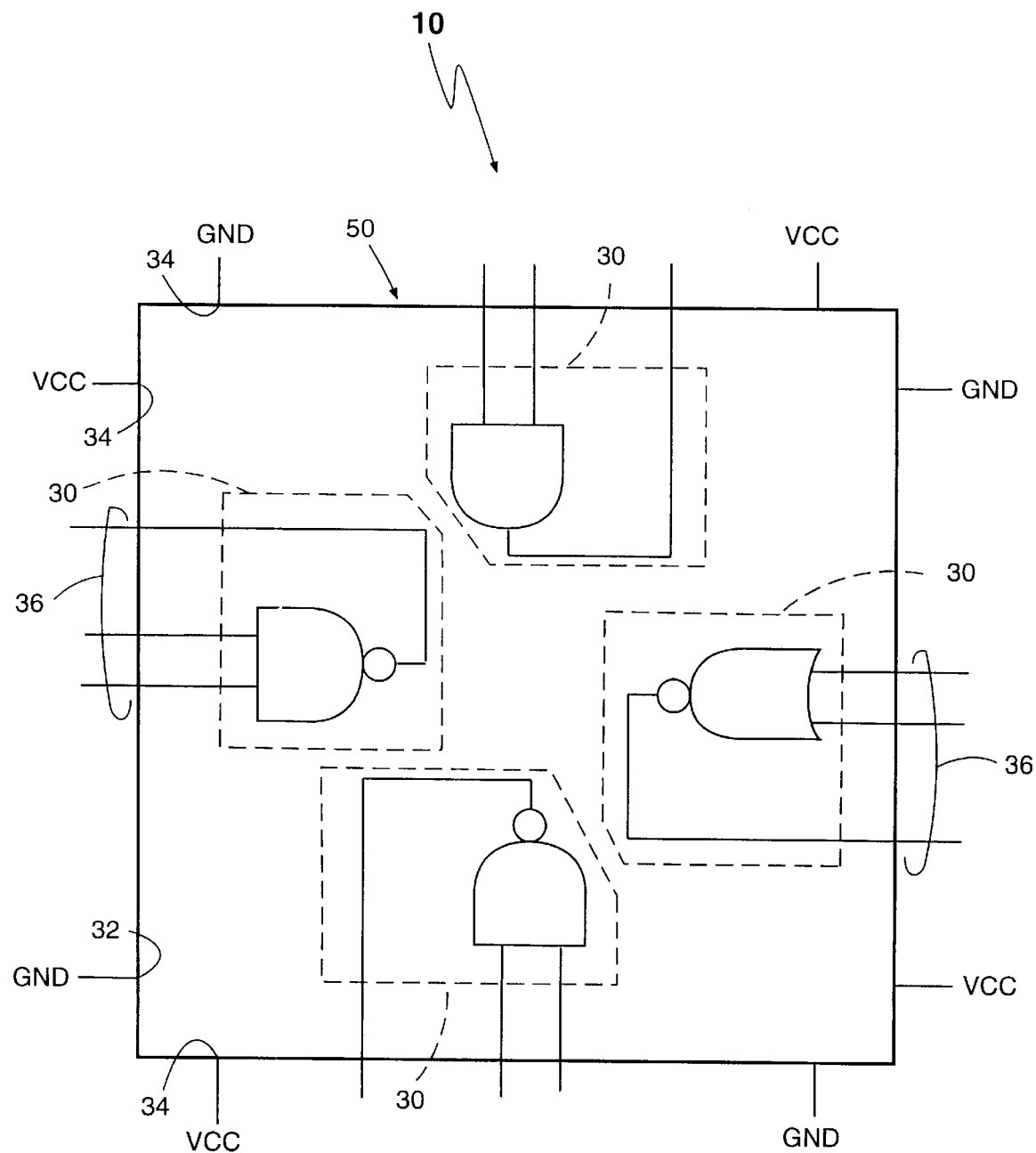
FIG. 6 is an electrical schematic of an alternative indexible chip operable between four orientations and having four on-board circuits having three different functions.

The possible orientations of the indexible chip 50 are not limited to just two. For instance, the indexible chip 50 of FIG. 6 may be oriented in any one of four different orientations. Note that in FIG. 6, only three types of on-board circuits 30 are shown, with two of the on-board circuits 30 being the same.

Figure 7:
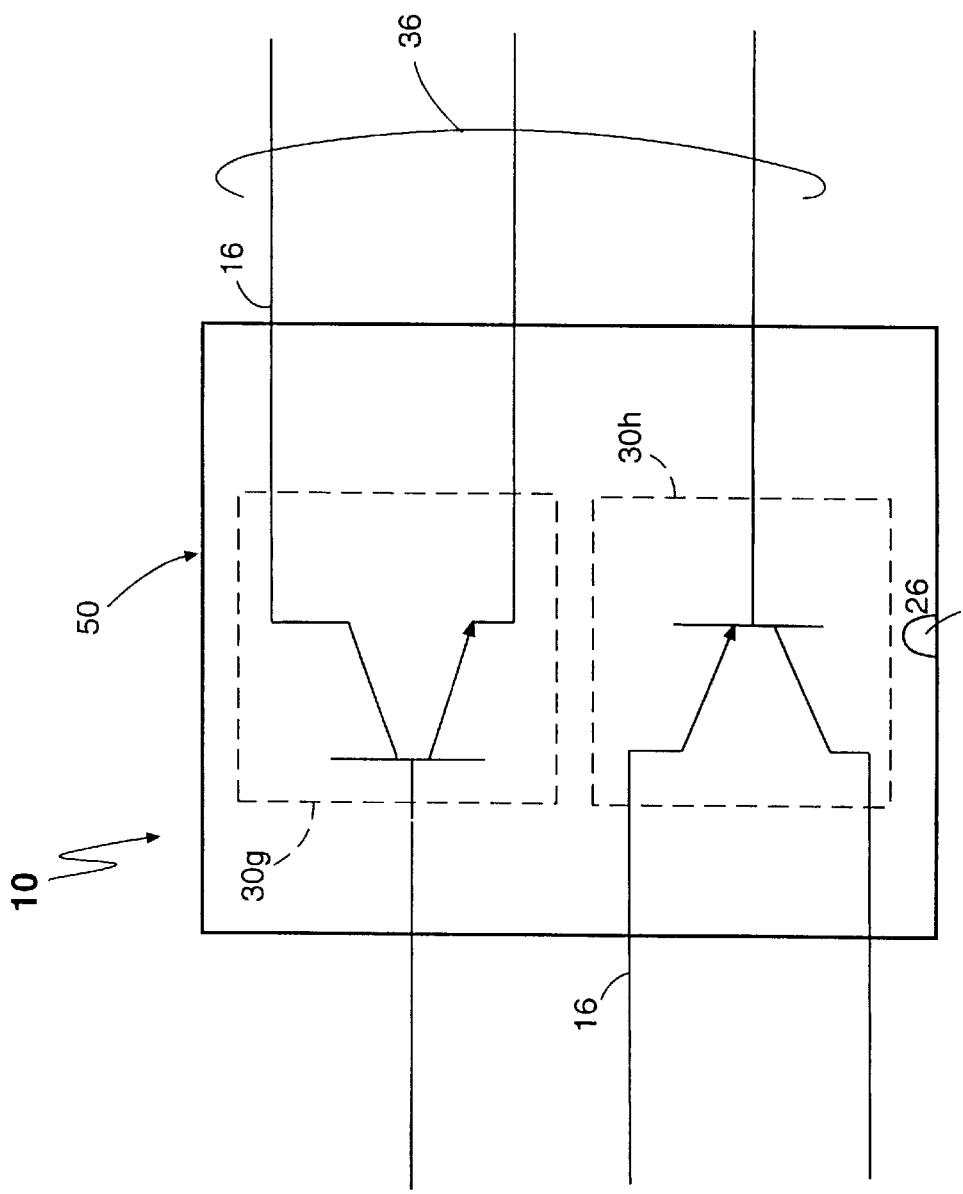
FIG. 7 is an electrical schematic of an alternative indexible chip without ground or power leads.

The embodiments above have utilized two or more ground ports 32 and power ports 34. However, such ports 32, 34 are not necessary in all cases. For instance, the indexible chip 50 shown in FIG. 7 has two varieties of transistors, a N-P-N junction 30g and a P-N-P junction 30h which do not require separate power and ground ports. The power for this chip is provided by the I/O ports. The transistors 30g, 30h of FIG. 7 could alternatively be replaced with Metal-Oxide Semiconductor Field Effect Transistors (MOSFETs) or the like.

It is clear from the discussion above that the indexible chip 50 used in the present invention is not limited to a particular set of on-board circuits 30. Rather, the indexible chip 30 used in the present invention may have a wide variety of on-board circuits 30, both digital and analog, and may include a variable number of leads 24 as appropriate. Further, it should be noted that the number of on-board circuits 30 need not be the same as the number of functional orientations for the indexible chip 50.

Like traditional IC chips 12, the indexible chip 50 may be mated to the traces 16 of the electrical circuit 10 by traditional soldering or wire wrap techniques. Alternatively, the indexible chip 50 may be removably mated to the traces 16 via a socket, such as a DIP socket or a Zero Insertion Force (ZIF) socket. Use of the socket approach allows for the orientation of the indexible chip 50, and thus the function of the electrical circuit 10, to be changed more easily by a user after manufacture. To change the function of the electrical circuit 10, one need only remove the indexible chip 50, reorient it, and then return the indexible chip 50 to the electrical circuit 10 with the new orientation. Alternatively, if the function is to be changed prior to manufacture, the function may be set by the proper initial orientation of the indexible chip 50, thereby allowing for changes to the electrical circuit 10 at manufacturing without adding or deleting components or changing trace 16 paths.

The indexible chip 50 has been identified as "indexible" to indicate that the indexible chip 50 is designed to be inserted into the electrical circuit 10 in one of a plurality of physical orientations. The leads 24 of the indexible chip 50 are preferably symmetric about the chip's center-point 52 so as to facilitate physical alignment of the indexible chip 50 in the electrical circuit 10. Thus, the indexible chip 50 may be indexed into one of a plurality of orientations, typically one of two orientations. As outlined above, the selection of which of the orientations the indexible chip 50 should assume may be changeable after initial manufacturing or may be relatively fixed at manufacturing.

It may be desirable for the electrical circuit 10 to contain additional components, or to be otherwise programmed, to automatically detect the orientation of the indexible chip 50. Based on this detected orientation, the additional changes may be automatically implemented in the electrical circuit 10 or elsewhere in the electrical device connected to the electrical circuit 10, possibly via resident software. Alternatively, there may be means, such as a button, for the user to indicate which orientation the indexible chip 50 is in.

The physical structure outlined above has assumed that the indexible chip 50 was a similar to a traditional IC chip 12 having leads 24 physically extending from a main housing 22. However, the inventive approach outlined above works equally well with indexible chips 50 employing surface mount, or similar, technology where the leads 24 (or equivalently balls as in a BGA approach) form a portion of the main housing 22.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. An electronic assembly for performing a plurality of different functions, comprising:
    a) an electrical circuit;
    b) an indexible integrated circuit chip forming a portion of said electrical circuit; said indexible chip operable in a plurality of physical orientations; and
    c) wherein the function of said electrical circuit is dependent upon the orientation of said indexible chip.

2. The assembly of claim 1 wherein said indexible chip includes a plurality of on-board circuits.

3. The assembly of claim 1 wherein said indexible chip includes a main housing having a center-point and a plurality of I/O ports and wherein said I/O ports are disposed symmetrically with respect to said center-point.

4. The assembly of claim 3 wherein said indexible chip further includes a plurality of ground ports and a plurality of power ports.

5. The assembly of claim 1 wherein said electrical circuit forms at least a portion of a communications interface.

6. The assembly of claim 5 wherein said indexible chip includes a plurality of on-board circuits and wherein said on-board circuits function as voltage level translators.

7. The assembly of claim 5 wherein said electrical circuit functions as a portion of a DCE communications interface when said indexible chip is in a first physical orientation and said electrical circuit functions as a portion of a DTE communications interface when said indexible chip is in a second physical orientation.

8. The assembly of claim 1 wherein the number of physical orientations is two.

9. The assembly of claim 1 wherein the number of physical orientations is eight.

10. An electronic assembly for performing a plurality of different functions, comprising:
   a) an electrical circuit;
   b) an indexible integrated circuit chip forming a portion of said electrical circuit; said indexible chip operable in a plurality of physical orientations;
   c) wherein said electrical circuit performs a first function when said chip is in a first orientation and performs a second function when said chip is in a second orientation.

11. The assembly of claim 10 wherein said indexible chip includes a main housing having a center-point and a plurality of I/O ports and wherein said I/O ports are disposed symmetrically with respect to said center-point.

12. The assembly of claim 10 wherein said indexible chip includes a plurality of ground ports and a plurality of power ports.

13. The assembly of claim 10 wherein said electrical circuit forms at least a portion of a communications interface.

14. The assembly of claim 13 wherein said indexible chip includes a plurality of on-board circuits and wherein said on-board circuits function as voltage level translators.

15. The assembly of claim 13 wherein said first function is as a portion of a DCE communications interface and said second function is as a portion of a DCE communications interface.

16. The assembly of claim 10 wherein the number of physical orientations is four.

17. The assembly of claim 10 wherein said first function and said second function are inverses.

18. The assembly of claim 10 further including a socket adapted to releaseably receive said indexible chip.

19. A method of programming an electrical circuit, comprising inserting an indexible chip into the electrical circuit in one of a plurality of operable physical orientations.

20. The method of claim 19 wherein said electrical circuit forms at least a portion of a communications interface.

* * * * *